United States Patent
Pavate et al.

(10) Patent No.: US 6,391,163 B1
(45) Date of Patent: May 21, 2002

(54) METHOD OF ENHANCING HARDNESS OF SPUTTER DEPOSITED COPPER FILMS

(75) Inventors: Vikram Pavate, San Jose; Murali Abburi, Santa Clara; Murali Narasimhan, San Jose; Seshadri Ramaswami, Saratoga, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/518,004

(22) Filed: Mar. 2, 2000

Related U.S. Application Data

(63) Continuation-in-part of application No. 09/406,325, filed on Sep. 27, 1999.

(51) Int. Cl.[7] .............................. C23C 14/34; C23C 9/00
(52) U.S. Cl. ............................ 204/192.15; 204/298.06; 204/298.13; 148/432; 148/434; 148/435; 148/436; 420/469; 420/477; 420/478; 420/479; 420/481; 420/485; 420/486; 420/487; 420/489; 420/490; 420/494; 420/496
(58) Field of Search ...................... 204/192.15, 298.06, 204/298.13; 205/184; 148/432, 434, 435, 436; 420/469, 477, 478, 479, 481, 485, 486, 487, 489, 490, 494, 496

(56) References Cited

U.S. PATENT DOCUMENTS

| | | | |
|---|---|---|---|
| 4,159,909 A | 7/1979 | Wilson ........................ 75/170 |
| 4,466,940 A | 8/1984 | Siewert et al. ............... 420/507 |
| 4,620,872 A | 11/1986 | Hijikata et al. ................ 75/246 |
| 4,808,373 A | 2/1989 | Hoffman et al. ............. 420/507 |
| 4,814,053 A | 3/1989 | Shimokawato ......... 204/192.15 |
| 4,885,029 A | 12/1989 | Buerkle et al. ................ 75/235 |
| 5,039,570 A | 8/1991 | Sturm ......................... 428/209 |
| 5,178,739 A | * 1/1993 | Barnes et al. ........... 204/192.12 |
| 5,330,629 A | 7/1994 | Cunningham et al. . 204/192.17 |
| 5,496,391 A | 3/1996 | Noel ............................ 75/255 |
| 5,567,382 A | 10/1996 | Danelia ....................... 419/19 |
| 5,599,740 A | 2/1997 | Jang et al. ................... 437/190 |
| 5,685,491 A | 11/1997 | Marks et al. .......... 239/533.12 |
| 5,686,335 A | 11/1997 | Wuu et al. ..................... 437/48 |
| 5,693,565 A | 12/1997 | Camilletti et al. ........... 437/192 |
| 5,801,100 A | 9/1998 | Lee et al. ..................... 438/678 |
| 5,803,342 A | 9/1998 | Kardokus ................ 228/173.2 |
| 5,809,393 A | 9/1998 | Dunlop et al. ................ 419/61 |
| 5,917,244 A | 6/1999 | Lee et al. .................... 257/762 |
| 6,160,315 A | * 12/2000 | Chiang et al. ............... 257/762 |

FOREIGN PATENT DOCUMENTS

| | | | | |
|---|---|---|---|---|
| DE | 299234 A7 | * 4/1992 | ........... C23C/14/18 |
| JP | 03289156 | 12/1991 | ........... H01L/21/90 |
| JP | 6-177117 | * 6/1994 | ........... H01L/21/31 |

* cited by examiner

*Primary Examiner*—Nam Nguyen
*Assistant Examiner*—Steven H. Ver Steeg
(74) *Attorney, Agent, or Firm*—Mosr, Patterson & Sheridan, LLP

(57) ABSTRACT

The present invention provides a method and apparatus for forming a copper layer on a substrate, preferably using a sputtering process. The sputtering process involves bombarding a conductive member of enhanced hardness with ions to dislodge the copper from the conductive member. The hardness of the target may be enhanced by alloying the copper conductive member with another material and/or mechanically working the material of the conductive member during its manufacturing process in order to improve conductive member and film qualities. The copper may be alloyed with magnesium, zinc, aluminum, iron, nickel, silicon and any combination thereof.

20 Claims, 2 Drawing Sheets

METHOD OF ENHANCING HARDNESS OF SPUTTER DEPOSITED COPPER FILMS

This application is a continuation-in-part of U.S. application Ser. No. 09/406,325 filed on Sep. 27, 1999, pending entitled "Method and Apparatus of Forming a Sputtered Doped Seed Layer."

BACKGROUND OF THE INVENTION

1. Field of the Invention

The present invention relates to the deposition of a layer on a substrate. More specifically, the invention relates to deposition of a doped layer on a substrate.

2. Background of the Related Art

Consistent and fairly predictable improvement in integrated circuit design and fabrication has been observed in the last decade. One key to successful improvements is multilevel interconnect technology, which provides the conductive paths between the devices of an integrated circuit (IC) and other electronic devices. The conductive paths, or features, of an IC typically comprise horizontal interconnects (also referred to as lines) and vertical interconnects (also referred to as contacts or vias). The shrinking dimensions of features, presently in the sub-quarter micron range, has increased the importance of reducing capacitive coupling between interconnect lines and reducing resistance in the conductive features.

Aluminum has traditionally been the choice of conductive materials used in metallization. However, smaller feature sizes have created a need for a conductive material with lower resistivity than aluminum. Copper is now being considered as an interconnect material to replace or complement aluminum because copper has a lower resistivity (1.7 $\mu\Omega$-cm compared to 3.1 $\mu\Omega$-cm for aluminum) and higher current carrying capacity.

As a result of the desirability of using copper for semiconductor device fabrication, current practice provides for sputtering high purity copper targets. High purity is considered desirable in order to ensure that the low resistivity of copper is not affected by contaminants. However, the inventors have discovered that high purity copper films suffer from electromigration. Electromigration refers to the solid diffusion of ions in the presence of electric fields. Atoms in a conductive material are displaced as a consequence of a direct momentum transfer from the conduction electrons in the direction of their motion. The large flux of electrons interacts with the diffusing atoms in the metal lattice and sweeps these atoms in the direction of electron flow. The transport of mass causes removal of material in some locations, which generates voids and the accumulation of material in other locations. As a result, electromigration causes failures by opening interconnect lines.

Therefore, there is a need for an improved copper based target material which mitigates the problems of electromigration.

SUMMARY OF THE INVENTION

The present invention generally provides a method and apparatus for forming a target material having enhanced hardness. The target material is well suited for sputtering processes wherein a portion of the material is deposited on a substrate such as by physical vapor deposition (PVD) or Ionized Metal Plasma (IMP) PVD.

In one aspect, the invention provides a method of sputtering a layer on a substrate, comprising generating a plasma in a substrate processing chamber, sputtering material from a conductive target, the target comprising a material having a vickers hardness between about 100 and about 250, and depositing the sputtered material on the substrate. In one embodiment, the target includes copper and another material selected from the group of magnesium, zinc, aluminum, iron, nickel, silicon and combinations thereof.

In yet another aspect, a conductive material having enhanced hardness is deposited on a substrate. The material comprises at least copper and has a vickers hardness of between about 100 and about 250. In one embodiment, the material comprises primarily copper combined with another material selected from the group of magnesium, zinc, aluminum, iron, nickel, silicon and combinations thereof.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
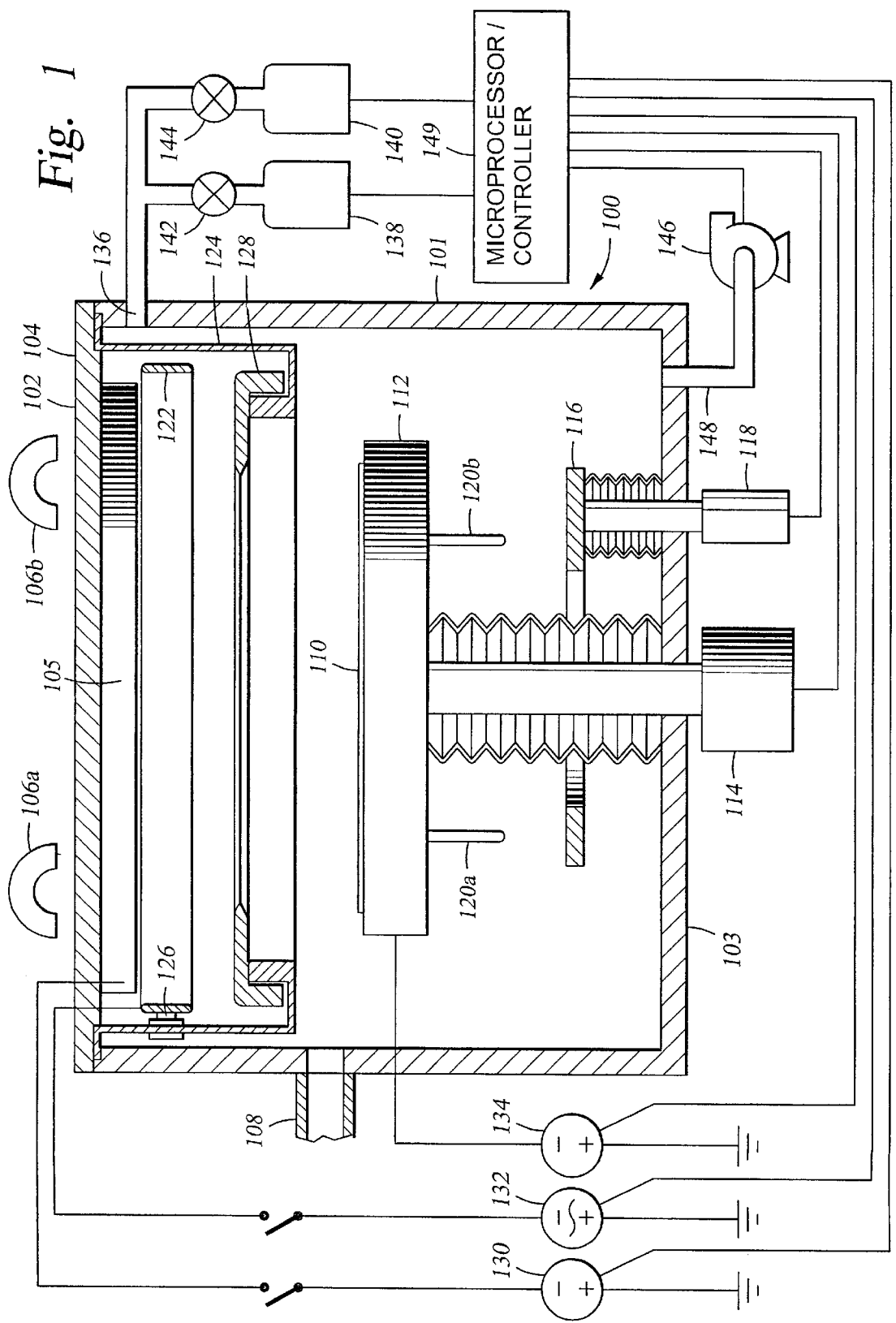
FIG. 1 is a schematic cross-sectional view of an IMP chamber.

The present invention provides a method and apparatus for forming a copper layer on a substrate, preferably using a sputtering process. The sputtering process involves bombarding a conductive member of enhanced hardness with ions to dislodge the copper from the conductive member. The hardness of the target may be enhanced by alloying the copper conductive member with another material and/or mechanically working the material of the conductive member during its manufacturing in order to improve conductive member and film qualities. As referred to herein "working" refers to any process by which a material is treated, conditioned or otherwise processed to affect the qualities, e.g. hardness, of the material. Illustratively, the following description refers to the conductive member as a target, which typically provides the bulk of the material to be deposited on a substrate. However, the conductive member may be any component which is sputtered and contributes to the deposition of material on the substrate.

The inventors have discovered that qualities such as the hardness, grain size, crystallographic orientation, etc. of target materials affect the quality of the resulting film produced by sputtering the target as well as the sputtering characteristics of the target. According to the invention, such qualities and characteristics can be affected by the methods and materials used to manufacture the target. As an example, the susceptibility of the deposited film to electromigration can be reduced. Additionally, microarcing on the surface of the target during sputtering can be mitigated.

Solid metals are typically composed of separate and discreet grains of continuous crystal lattice rather than one continuous crystal structure. Depending on the composition and forming method of the metal, these grains can vary in size from the millimeter range to the micron range. By providing targets having smaller grain size the invention mitigates the problems of electromigration and microarcing.

Another factor which affects microarcing on the target surface and the electromigration characteristics of the deposited material, is the crystallographic orientation of the grains. Each grain is a continuous crystal, with its crystal lattice oriented in some particular way relative to a reference plane such as the sputtering surface of the target. Since each grain is independent of others, each grain lattice has its own orientation relative to this plane. When grain orientation is not random and crystal planes tend to be aligned in some way relative to a reference plane, the material is said to have "texture". These textures are noted using standard indices which define directions relative to crystallographic planes. For instance, a target made from a metal with cubic crystal structure, such as copper, may have a <100>, a <110> or other textures. The exact texture developed will depend on the metal type and the work and heat treatment history of the target.

In one embodiment, a copper target is alloyed with another material (herein referred to as the alloy) to increase the hardness of the target. The target is preferably made of copper and an alloy selected from the group of magnesium, zinc, aluminum, iron, nickel, silicon and any combination thereof. The percentage by weight of the alloy is from about 0.01% to about 10%, and most preferably from about 0.01% to about 5%. In one embodiment, the vickers hardness of the target is between about 100 and about 250.

A number of processes known to metallurgists can be adapted to produce a copper-alloy target. The target can be prepared, for example, by uniformly mixing the alloy into a molten copper material which is then cast and cooled to form the target. The alloy material may be provided in the form of a pellet which is then added to the molten copper. By alloying the copper target in such a manner, it is believed the hardness of the target can be enhanced. The inventors have discovered that a target of enhanced hardness mitigates the problems of electromigration associated with the prior art high purity copper targets. Further, even where the alloy material has a higher resistivity than copper, such as where aluminum is used to alloy the copper target, the effect on the resistivity of the resulting film formed on the substrate is minimal because of the relative proportions of the alloy to the copper.

The copper-alloy target of the invention can then be sputtered to form a copper alloy film on a substrate. The resulting alloyed film exhibits superior resistance to electromigration. In one application, the target can be sputtered to produce a seed layer on features formed on a substrate. The substrate may then undergo various additional processes including an electroplating process wherein the features are filled with a material, such as copper. It is believed that a portion of the alloy material diffuses into the fill material. As a result, the fill material is made more resistant to electromigration. Even though the alloy material will typically have a higher resistivity than copper, the amount of alloy used, by weight percentage of the target, is minimal compared to the weight percentage of copper in the target. Thus, the effect on the overall resistivity is negligible. The proper proportions of alloy to be combined with the copper during the manufacturing of the target can be determined by the volume of the features to be filled, thereby ensuring that sufficient alloy is diffused into the fill material without compromising the resistivity of the deposited material.

In another embodiment, the hardness of a copper target is increased by mechanically working the target material(s) by metallurgical methods. Work hardening the target allows the grain size of the target material to be changed to produce a relatively harder target. In a preferred embodiment, a copper-alloy target has a vickers hardness between about 100 and about 250. Illustratively, methods of manufacturing a copper—alloy target include casting, forming, annealing, rolling, forging, liquid dynamic compaction (LDC), equal channel angular extrusion (ECA) and other methods known and unknown in metallurgy. Although one embodiment of the invention contemplates using known metallurgical methods, such methods have heretofore not been used in the production of copper-alloy targets for the purpose of enhancing their hardness.

The copper-alloy target of the invention can be utilized in any sputtering chamber. One such sputtering chamber is the Ionized Metal Plasma (IMP) Vectra™ chamber, available from Applied Materials, Inc. of Santa Clara, Calif. An IMP process provides a higher density plasma than standard PVD that causes the sputtered target material to become ionized. The ionization enables the sputtered material to be attracted in a substantially perpendicular direction to a biased substrate surface and to deposit a layer within high aspect ratio features.

FIG. 1 is a schematic cross-sectional view of an IMP chamber 100, capable of generating a relatively high density plasma, i.e., one with a capability to ionize a significant fraction of both the process gas (typically argon) and the sputtered target material. The chamber 100 includes sidewalls 101, lid 102, and bottom 103. The lid 102 includes a target backing plate 104 which supports a target 105 of the material to be deposited.

An opening 108 in the chamber 100 provides access for a robot (not shown) to deliver and retrieve substrates 110 to and from the chamber 100. A substrate support 112 supports the substrate 110 in the chamber and is typically grounded. The substrate support 112 is mounted on a lift motor 114 that raises and lowers the substrate support 112 and a substrate 110 disposed thereon. A lift plate 116 connected to a lift motor 118 is mounted in the chamber 100 and raises and lowers pins 120a, 120b mounted in the substrate support 112. The pins 120a, 120b raise and lower the substrate 110 from and to the surface of the substrate support 112.

A coil 122 is mounted between the substrate support 112 and the target 105 and provides inductively-coupled magnetic fields in the chamber 100 to assist in generating and maintaining a plasma between the target 105 and substrate 110. The coil 122 is also sputtered due to its location between the target and the substrate 110 and preferably is made of similar constituents as the target 105. Thus, the coil comprises copper and an alloy selected from the group of magnesium, zinc, aluminum, iron, nickel, silicon and any combination thereof. The alloy percentage of the coil 122 could vary compared to the target alloy percentage depending on the desired layer composition and is empirically determined by varying the relative weight percentages. Power supplied to the coil 122 provides an electromagnetic field in the chamber 100 that induces currents in the plasma to increase the density of the plasma, thereby enhancing the ionization of the sputtered material. The ionized material is then directed toward the substrate 110 and deposited thereon.

A shield 124 is disposed in the chamber 100 to shield the chamber sidewalls 101 from the sputtered material. The shield 124 also supports the coil 122 by coil supports 126. The coil supports 126 electrically insulate the coil 122 from the shield 124 and the chamber 100 and can be made of similar material as the coil. The clamp ring 128 is mounted between the coil 122 and the substrate support 112 and shields an outer edge and backside of the substrate from sputtered materials when the substrate 110 is raised into a processing position to engage the lower portion of the clamp ring 128. In some chamber configurations, the shield 124 supports the clamp ring 128 when the substrate 110 is lowered below the shield 124 to enable substrate transfer.

Three power supplies are used in this type of sputtering chamber. A power supply 130 delivers preferably DC power to the target 105 to cause the processing gas to form a plasma, although RF power can be used. Magnets 106a, 106b disposed behind the target backing plate 104 increase the density of electrons adjacent to the target 105, thus increasing ionization at the target to increase the sputtering efficiency. The magnets 106a, 106b generate magnetic field lines generally parallel to the face of the target, around which electrons are trapped in spinning orbits to increase the likelihood of a collision with, and ionization of, a gas atom for sputtering. A power supply 132, preferably a RF power supply, supplies electrical power to the coil 122 to couple with and increase the density of the plasma. Another power supply 134, typically a DC power supply, biases the substrate support 112 with respect to the plasma and provides directional attraction (or repulsion) of the ionized sputtered material toward the substrate 110.

Processing gas, such as an inert gas of argon or helium or a reactive gas such as nitrogen, is supplied to the chamber 100 through a gas inlet 136 from gas sources 138, 140 as metered by respective mass flow controllers 142, 144. A vacuum pump 146 is connected to the chamber 100 at an exhaust port 148 to exhaust the chamber 100 and maintain the desired pressure in the chamber 100.

A controller 149 generally controls the functions of the power supplies, lift motors, mass flow controllers for gas injection, vacuum pump, and other associated chamber components and functions. The controller 149 controls the power supply 130 coupled to the target 105 to cause the processing gas to form a plasma and sputter the target material. The controller 149 also controls the power supply 132 coupled to the coil 122 to increase the density of the plasma and ionize the sputtered material. The controller 149 also controls the power supply 134 to provide directional attraction of the ionized sputtered material to the substrate surface.

The controller 149 preferably comprises a central processing unit (CPU), a memory, and support circuits for the CPU. To facilitate control of the chamber, the CPU may be one of any form of general purpose computer processor that can be used in an industrial setting for controlling various chambers and subprocessors. The memory is coupled to the CPU. The memory, or computer-readable medium, may be one or more of readily available memory such as random access memory (RAM), read only memory (ROM), floppy disk drive, hard disk, or any other form of digital storage, local or remote. The support circuits are coupled to the CPU for supporting the processor in a conventional manner. These circuits include cache, power supplies, clock circuits, input/output circuitry and subsystems, and the like. A deposition process is generally stored in the memory, typically as a software routine. The software routine may also be stored and/or executed by a second CPU that is remotely located from the hardware being controlled by the CPU of the controller 149.

In one embodiment, a seed layer is deposited on a substrate by sputtering the target 105. A noble gas, such as helium or argon, is flown into the chamber at a rate sufficient to produce a chamber pressure of about 5 to about 100 mTorr, preferably about 20 mTorr to about 50 mTorr. The power supply 130 delivers about 200 Watts (W) to about 12 kW, preferably about 750 W to about 3 kW to the target 105. The power supply 132 delivers an AC signal to the coil 122 between about 500 W and about 5 kW, and preferably about 1.5 kW to about 2.5 kW. The power supply 134 delivers about 0 W to about 600 W, preferably about 350 W to about 500 W to the substrate support 112 with a duty cycle between 0% to 100% and preferably about 50% to about 75%. When the substrate temperature is controlled, a surface temperature between about −50° C. to about 150° C., preferably below 50° C. is useful for processing during the seed layer deposition. The sputtered target material is deposited on the substrate to a thickness of about 500 Å to about 4000 Å, preferably about 2000 Å.

The above parameters are preferably used to deposit a layer on a 200 mm substrate and are not intended to be limiting. For example, power densities may be determined from the given power ranges and scaled up to larger substrates, such as 300 mm substrates, or down to smaller substrates, such as 100 mm substrates.

Further, although the chamber described above is an IMP chamber other chambers may be used. Thus, in one embodiment, the target 105 is disposed in a PVD chamber. In some cases, the above described parameters are dependent on the particular chamber type. For example, in one embodiment utilizing a PVD chamber, the power level delivered to the target 105 by the power supply 130 is between about 200 W to about 12 kW. In an embodiment utilizing an IMP chamber, the power level delivered to the target 105 by the power supply 130 is between about preferably about 750 W to about 3 kW.

Figure 2:
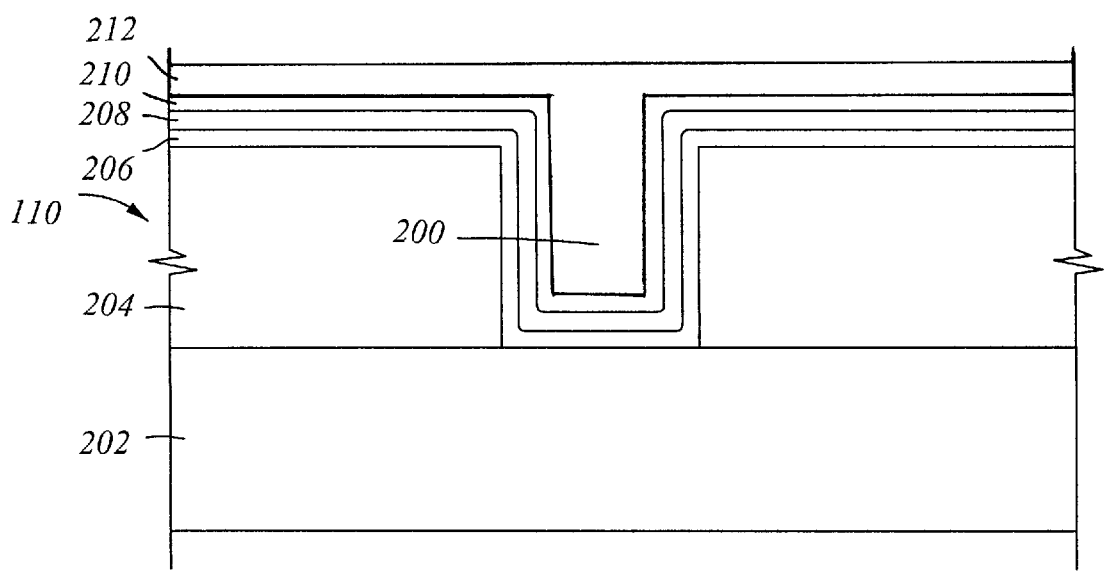
FIG. 2 is a schematic cross-sectional view of a substrate with a seed layer formed on the substrate.

FIG. 2 is a schematic cross-sectional view of an exemplary substrate 110 formed according to a process of the invention. A dielectric layer 204 is deposited on an underlying material 202 and etched to form the feature 200, such as a via, contact, trench or line. The term "substrate" is broadly defined as the underlying material and can include a series of underlying layers. The dielectric layer 204 can be a pre-metal dielectric layer deposited over a silicon wafer or an interlevel dielectric layer.

A liner layer 206, such as a Ta layer, is deposited on the dielectric layer 204 as a transition layer to promote adhesion to the underlying material and reduce contact/via resistance. The liner layer 206 is preferably deposited using an IMP PVD process and can be deposited by other PVD processes, such as collimated or long throw sputtering or other methods such as CVD. Collimated sputtering is generally performed by placing a collimator (not shown) between the target and the substrate to filter sputtered material traveling obliquely through the collimator. Long throw sputtering is generally performed by increasing the spacing between the target and the substrate. The increased distance increases the probability that the sputtered material reaching the substrate is directed normal to the substrate surface. A barrier layer 208 of tantalum nitride (TaN) is deposited on the liner layer 206 using PVD, and preferably an IMP PVD process, especially for high aspect ratio features. The barrier layer prevents diffusion of copper into adjacent layers. While Ta/TaN are preferred, other liner and/or barrier layers that can be used are titanium (Ti), titanium nitride (TiN), tungsten (W), tungsten nitride (WN) and other refractory metals and their nitrided counterparts.

A seed layer 210 is deposited over the TaN barrier layer 208, using PVD and preferably IMP PVD. The seed layer 210 is deposited by sputtering a copper/copper-alloy target of the invention. The seed layer 210 is deposited over the barrier layer 208 as a seed layer for a subsequent copper fill 212.

The copper fill 212 can be deposited by PVD, IMP, CVD, electroplating, electroless deposition, evaporation, or other known methods. Preferably, copper fill 212 is deposited using electroplating techniques. Subsequent processing can include planarization by chemical mechanical polishing (CMP), additional deposition of layers, etching, and other processes known to substrate manufacturing.

The hardened target material of the invention is believed to reduce the potential for electromigration during operation of the devices formed on the substrate 110 surface. Additionally, empirical evidence suggests that harder targets result in reduced arcing between the target and an adjacent structure, where the arcing dislodges unwanted pieces of the target (splats) that are deposited on the substrate and contaminates the deposition.

Variations in the orientation of the chambers and other system components are possible. Additionally, all movements and positions, such as "above," "top," "below," "under," "bottom," "side," described herein are relative to positions of objects such as the target, substrate, and coil. Accordingly, it is contemplated by the present invention to orient any or all of the components to achieve the desired support of substrates in a processing system.

While the foregoing is directed to the preferred embodiment of the present invention, other and further embodiments of the invention may be devised without departing from the basic scope thereof and the scope thereof is determined by the claims that follow.

What is claimed is:

1. A conductive target for sputtering a layer on a substrate, comprising copper and having a vickers hardness between about 100 and about 250.

2. The conductive target of claim 1, wherein the conductive target is produced by mechanically working the conductive target by metallurgical methods.

3. The conductive target of claim 1, wherein the conductive target further comprises an alloying material selected from the group of magnesium, zinc, aluminum, iron, nickel, silicon and any combination thereof.

4. The conductive target of claim 3, wherein the weight percentage of the alloying material is between about 0.01% and about 10%.

5. The conductive target of claim 3, wherein the weight percentage of the alloying material is between about 0.01% and about 5%.

6. A method of sputtering a layer on a substrate, comprising:
   a) generating a plasma in a substrate processing chamber;
   b) sputtering material from a conductive target, the target comprising copper and having a vickers hardness between about 100 and about 250; and
   c) depositing the sputtered material on the substrate.

7. The method of claim 6, further comprising mechanically working the conductive target by metallurgical methods.

8. The method of claim 6, wherein the conductive target further comprises an alloying material selected from the group of magnesium, zinc, aluminum, iron, nickel, silicon and any combination thereof.

9. The method of claim 6, further comprising depositing a copper layer over at least a portion of the sputtered material on the substrate by an electroplating process.

10. The method of claim 6, further comprising sputtering material from a coil comprising:
    a) copper; and
    b) a material selected from the group of zinc, iron, nickel, silicon and any combination thereof.

11. An apparatus for depositing a material on a substrate, comprising:
    a) a processing chamber; and
    b) a conductive target disposed in the processing chamber having a vickers hardness between about 100 and about 250, the conductive target comprising:
       i) copper; and
       ii) an alloying material selected from the group of magnesium, zinc, aluminum, iron, nickel, silicon and any combination thereof.

12. The apparatus of claim 11, wherein the weight percentage of the alloying material is between about 0.01% and about 10%.

13. The apparatus of claim 11, wherein the weight percentage of the alloying material is between about 0.01% and about 5%.

14. The apparatus of claim 11, further comprising a power supply coupled to the target to supply a power between about 200 Watts and about 12 kWatts.

15. The apparatus of claim 11, further comprising a coil bias generator coupled to a coil disposed in proximity to the target.

16. The apparatus of claim 15, wherein the coil comprises copper and a material selected from the group of magnesium, zinc, aluminum, iron, nickel, silicon and any combination thereof.

17. The apparatus of claim 15, wherein the coil comprises substantially the same material as the target.

18. The apparatus of claim 15, further comprising a controller wherein the controller is programmed to control application of about 500 Watts to about 5000 Watts to the coil with the coil bias generator to ionize doped target material sputtered from the target.

19. A coil for sputtering adapted to sustain a current when the coil is coupled to a power source, comprising:
    a) copper; and
    b) an alloying material selected from the group of zinc, iron, nickel, silicon and any combination thereof the coil having a vickers hardness between about 100 and about 250.

20. The coil of claim 19, wherein the weight percentage of the alloying material is between about 0.01% and about 10%.

* * * * *

UNITED STATES PATENT AND TRADEMARK OFFICE
CERTIFICATE OF CORRECTION

PATENT NO. : 6,391,163 B1
DATED : May 21, 2002
INVENTOR(S) : Pavate et al.

It is certified that error appears in the above-identified patent and that said Letters Patent is hereby corrected as shown below:

<u>Title page,</u>
Item [74], please change "Mosr" to -- Moser --.

Signed and Sealed this

Thirty-first Day of December, 2002

JAMES E. ROGAN
*Director of the United States Patent and Trademark Office*